United States Patent
Yanagihara et al.

(10) Patent No.: US 9,461,414 B2
(45) Date of Patent: Oct. 4, 2016

(54) SHIELDING UNIT

(71) Applicant: Yazaki Corporation, Tokyo (JP)

(72) Inventors: Yusuke Yanagihara, Kakegawa (JP); Takashi Ishihara, Kakegawa (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/970,685

(22) Filed: Dec. 16, 2015

(65) Prior Publication Data

US 2016/0104977 A1   Apr. 14, 2016

Related U.S. Application Data

(63) Continuation of application No. PCT/JP2014/065902, filed on Jun. 16, 2014.

(30) Foreign Application Priority Data

Jun. 18, 2013   (JP) .................................. 2013-127506

(51) Int. Cl.
H05K 9/00      (2006.01)
H01R 13/6593   (2011.01)

(52) U.S. Cl.
CPC ........ H01R 13/6593 (2013.01); H05K 9/0018 (2013.01)

(58) Field of Classification Search
CPC .................................................. H05K 9/0018
See application file for complete search history.

(56) References Cited

U.S. PATENT DOCUMENTS

| 2001/0027040 A1* | 10/2001 | Yoshioka | H01R 4/646 439/98 |
| 2003/0062177 A1* | 4/2003 | Yagi | H01R 9/032 174/359 |
| 2004/0011550 A1* | 1/2004 | Imai | H01R 9/0518 174/74 R |
| 2005/0208798 A1* | 9/2005 | Shimoda | B60L 11/1803 439/98 |

(Continued)

FOREIGN PATENT DOCUMENTS

| JP | 2002-329557 A | 11/2002 |
| JP | 2004-327100 A | 11/2004 |

(Continued)

OTHER PUBLICATIONS

International Search Report of PCT/JP2014/065902 dated Jul. 29, 2014.

*Primary Examiner* — Hung V Ngo
(74) *Attorney, Agent, or Firm* — Sughrue Mion, PLLC

(57) ABSTRACT

A shielding unit is formed by attaching a shell internal cylinder and shell external cylinder of a shielding shell onto each other such that a cylindrical portion of a shielding member is sandwiched by an external cylindrical portion and an internal cylindrical portion press-fit therein while a flange portion of the shielding member is sandwiched by an internal cylinder flange portion and an external cylinder flange portion. By turning the shell internal cylinder in a counterclockwise direction with respect to the shell external cylinder, a positioning pin of the shell internal cylinder is moved to a counterclockwise direction end portion of a positioning guide hole of the shell external cylinder. This slides the cylindrical portion against at least one among the internal cylindrical portion and the external cylindrical portion, and slides the flange portion against at least one among the internal cylinder flange portion and the external cylinder flange portion.

4 Claims, 5 Drawing Sheets

(56) References Cited

U.S. PATENT DOCUMENTS

| | | | |
|---|---|---|---|
| 2005/0266729 A1 | 12/2005 | Fukushima et al. | |
| 2008/0164059 A1* | 7/2008 | Cipolla | H05K 9/0018 174/360 |
| 2009/0126987 A1* | 5/2009 | Gladd | H01R 13/658 174/393 |
| 2012/0028500 A1 | 2/2012 | Lee et al. | |
| 2013/0087377 A1* | 4/2013 | Adachi | H01R 13/648 174/372 |
| 2013/0175080 A1* | 7/2013 | Colahan | H05K 9/0018 174/357 |
| 2013/0319720 A1* | 12/2013 | Aoyama | H05K 9/0018 174/68.3 |
| 2014/0138144 A1* | 5/2014 | Hamouz | H05K 9/0018 174/360 |
| 2016/0205815 A1* | 7/2016 | Mori | H05K 9/0018 174/360 |

FOREIGN PATENT DOCUMENTS

| | | |
|---|---|---|
| JP | 2005-339933 A | 12/2005 |
| JP | 2006-260985 A | 9/2006 |
| JP | 2012-521068 A | 9/2012 |
| WO | 2010/107197 A2 | 9/2010 |

* cited by examiner

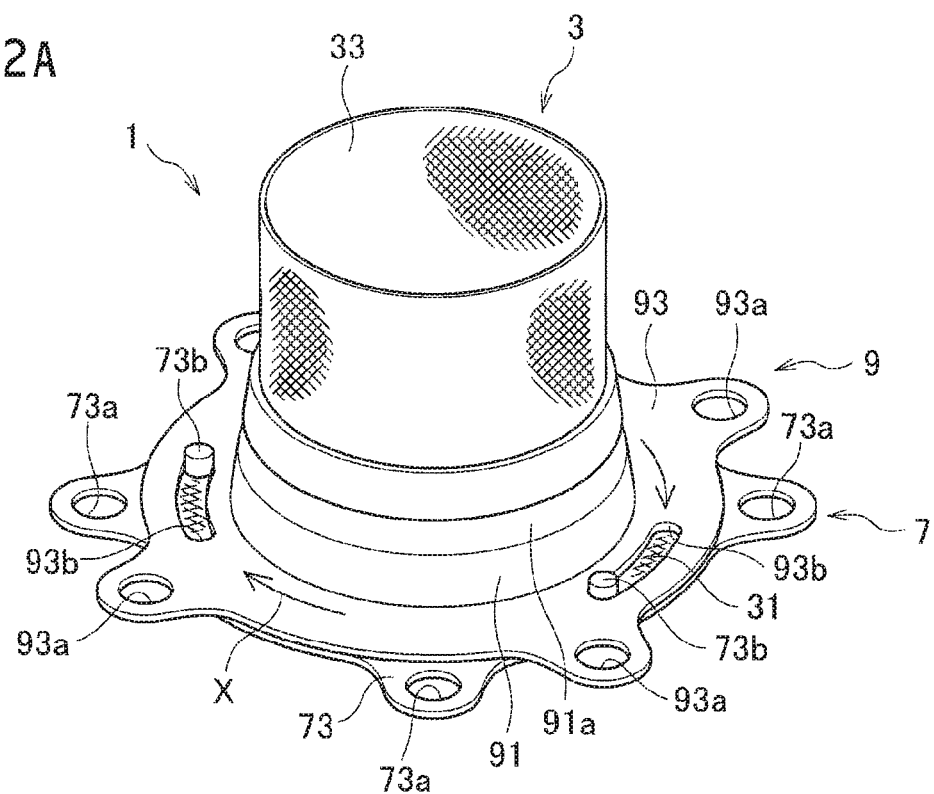
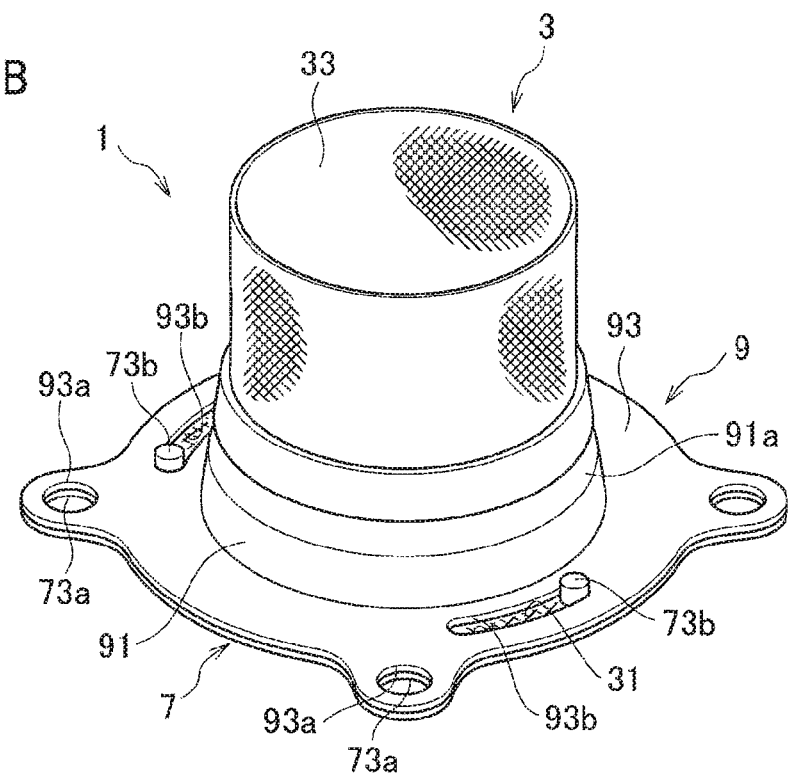

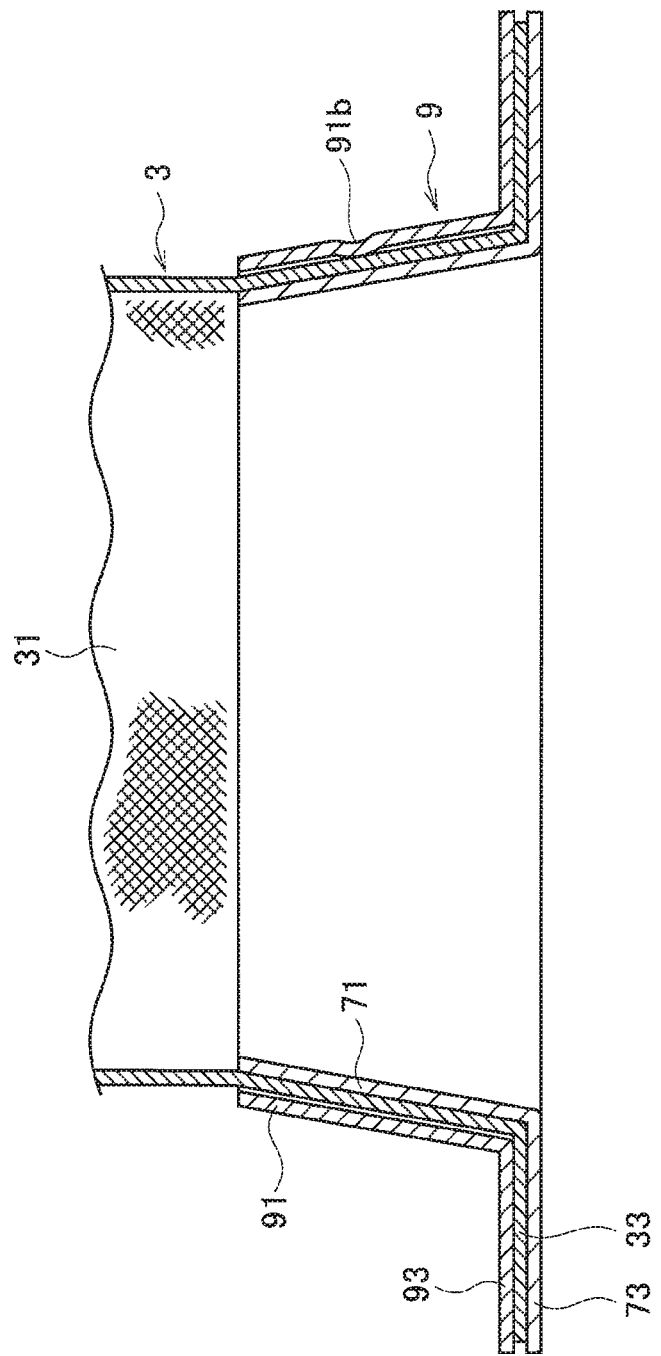

SHIELDING UNIT

CROSS REFERENCE TO RELATED APPLICATIONS

This application is a continuation of International Application No. PCT/JP2014/065902, filed Jun. 16, 2014, and based upon and claims the benefit of priority from Japanese Patent Application No. 2013-127506, filed Jun. 18, 2013, the entire contents of all of which are incorporated herein by reference.

BACKGROUND

1. Technical Field

The present application relates to a shielding unit constructed by connecting a shielding shell to an open end of a shielding member.

2. Related Art

A shielding cable that handles a high voltage for an electric vehicle (EV) or a hybrid electric vehicle (HEV) etc. is provided with a shielding unit electrically connected to a shielding case. The shielding unit includes a shielding member, such as a braided wire covering a bundle of wires, and a shielding shell connected to an open end of the shielding member. When the shielding shell is fixed to the shielding case connected to ground, the shielding member is electrically conducted to the shielding case through the shielding shell, and the bundle of wires covered with the shielding member functions as a shielding cable having a shielding property against high frequency noises.

The connection between the shielding member and the shielding shell is mainly carried out by using either a crimp ring or an internal cylinder and an external cylinder both constituting the shielding shell. In the former case, the end of the shielding member fitted on a cylindrical portion of the shielding shell is crimped from its outside by the crimp ring, thereby fixing the shielding member to the cylindrical portion. In the latter case, the end of the shielding member is sandwiched by the internal cylinder and the external cylinder, thereby fixing the shielding member to the shielding shell (see JP 2002-329557 A).

SUMMARY

In the former method of using the crimp ring of the above-described conventional connection methods, the processing cost is increased because the method requires an installation such as a crimping machine. In the latter method where the shielding member is sandwiched by the internal cylinder and the external cylinder, if the shielding member or the shielding shell is made of aluminum or the like, then it is necessary to ensure a desired shielding performance since an oxide film covering its surface deteriorates the conductivity of the film's portion in contact with the internal cylinder or the external cylinder.

Under such a situation as mentioned above, an object of the present application is to provide a shielding unit which removes an oxide film present on the shielding member or the shielding shell without depending on a processing machine, thereby allowing a connection between the shielding member and the shielding shell with improved conductivity.

In order to attain the above object, a shielding unit according to an aspect of the present application includes a shielding member in a form of a cylinder having conductivity, and a shielding shell connected to an end of the shielding member. The shielding shell includes a shell internal cylinder having an internal cylinder flange portion provided at an end of an internal cylindrical portion in a form of a cylinder consecutively, and a shell external cylinder having an external cylinder flange portion consecutively provided at an end of an external cylindrical portion in a form of a cylinder into which the internal cylindrical portion is press-fitted. The shielding member is sandwiched by the external cylindrical portion and the internal cylindrical portion press-fitted into the external cylindrical portion. The internal cylinder flange portion includes either one of a positioning pin and a positioning guide hole which are engaged with each other under condition that the shielding member is sandwiched by the external cylindrical portion and the internal cylindrical portion press-fitted into the external cylindrical portion, while the external cylinder flange portion includes the other of the positioning pin and the positioning guide hole. The positioning pin and the positioning guide hole are configured to position and guide a relative rotational position of the shell internal cylinder in relation to the shell external cylinder in the sandwiched condition, in a circumferential direction of the internal cylindrical portion and the external cylindrical portion.

With this configuration, on condition of press-fitting the cylindrical portion of the shell internal cylinder into the external cylindrical portion of the shell external cylinder thereby allowing the internal cylindrical portion and the external cylindrical portion to sandwich the shielding member, the positioning pin of the external cylinder flange portion or the internal cylinder flange portion is inserted into the positioning guide hole. Subsequently, when rotationally moving the shell internal cylinder and the shell external cylinder relatively to each other in the circumferential direction of the internal cylindrical portion and the external cylindrical portion, the positioning pin inserted into the positioning guide hole moves in the positioning guide hole while the internal cylindrical portion and the external cylindrical portion are sandwiching the shielding member, so that the shell external cylinder is positioned and guided in the rotating direction, in relation to the shell internal cylinder.

During this rotational movement, the shielding member sandwiched by the internal cylindrical portion and the external cylindrical portion, and at least one of the internal cylindrical portion and the external cylindrical portion slide against each other under in a pressure contact condition. As a result, oxide films on at least one of the internal cylindrical portion and the external cylindrical portion and the shielding member are removed due to friction between respective sliding counterparts. Consequently, in respective portions of at least one of the internal cylindrical portion and the external cylindrical portion and the shielding member, in which oxide films thereon have been removed, there is ensured good conductivity without any oxide film being interposed therebetween.

Therefore, with the removal of oxide films on the shielding member and the shielding shell irrespective of a processing machine, it is possible to connect the shielding member to the shielding shell with high conductivity.

Either one of the internal cylindrical portion and the external cylindrical portion may be provided with a locking portion which is locked to the shielding member in the sandwiched condition to restrain a relative movement of the shielding member in the circumferential direction.

With this configuration, when the shell internal cylinder and the shell external cylinder are rotationally moved relatively to each other in the circumferential direction of the internal cylindrical portion and the external cylindrical portion, the shielding member sandwiched by the internal cylindrical portion and the external cylindrical portion rotates together with the one of the internal cylindrical portion and the external cylindrical portion, which is provided with the locking portion, and also slides against the other of the internal cylindrical portion and the external cylindrical portion, which is not provided with the locking portion.

For this reason, when rotationally moving the shell internal cylinder and the shell external cylinder relatively to each other, the sliding of the shielding member in relation to either one of the internal cylindrical portion and the external cylindrical portion and the resulting removal of oxide films on either of the internal cylindrical portion and the external cylindrical portion and the shielding member are surely caused to allow the shielding member and the shielding shell to be connected to each other with high conductivity.

Under condition that the shielding member is sandwiched by the external cylindrical portion and the internal cylindrical portion press-fitted into the external cylindrical portion, the internal cylinder flange portion and the external cylinder flange portion may be configured to sandwich an end of the shielding member.

With this configuration, the sandwiching for the shielding member by with the shell internal cylinder and the shell external cylinder is performed not only between the internal cylindrical portion and the external cylindrical portion but between the internal cylindrical flange portion and the external cylindrical flange portion, the contact area between shielding member and the shielding shell is increased.

Thus, since the sliding is caused also between at least one of the internal cylindrical portion and the external cylindrical portion and the shielding member when rotationally moving the shell internal cylinder and the shell external cylinder relatively to each other, the removal of oxide films on at least one of the internal cylindrical portion and the external cylindrical portion and the shielding member, which results from the sliding, can be caused in a broader area. Consequently, it is possible to connect the shielding member to the shielding shell with high conductivity.

The internal cylinder flange portion and the external cylinder flange portion may be provided with attachment holes respectively and furthermore, the attachment hole of the internal cylinder flange portion and the attachment hole of the external cylinder flange portion may be configured to overlap each other in a rotational position where the positioning pin is located at one end of the positioning guide hole in the circumferential direction.

With this configuration, the shielding shell ensuring the conductivity with the sandwiched shielding member is attached and fixed to a shielding case by a screw which is inserted into the shell internal cylinder and the shell external cylinder while their attachment holes are laid to overlap each other.

Then, when the shell internal cylinder and the shell external cylinder by which the shielding member is sandwiched are rotationally moved relatively to each other to locate the positioning pin at the end of the positioning guide hole in the circumferential direction, the respective attachment holes of the shell internal cylinder and the shell external cylinder overlap each other.

During the rotational movement for sliding at least one of the internal cylindrical portion and the external cylindrical portion and the shielding member, therefore, by allowing the positioning pin to abut against the end of the positioning guide hole in the circumferential direction, it is possible to overlap both attachment holes of the shell internal cylinder and the shell external cylinder on each other, thereby bringing the shielding unit into a condition attachable to the shielding case.

With the shielding unit according to the aspect of the present application, it is possible to remove oxide films on the shielding member and the shielding shell irrespective of a processing machine and also possible to connect the shielding member to the shielding shell with high conductivity.

BRIEF DESCRIPTION OF DRAWINGS

FIGS. 2A and 2B are perspective views illustrating the procedure of assembling the shielding shell of FIG. 1.

FIG. 5 is a sectional view illustrating an assembled state of the shielding unit sandwiching the shielding member by the shell external cylinder of FIG. 4 and the shell internal cylinder of FIG. 1.

DETAILED DESCRIPTION

Figure 1:
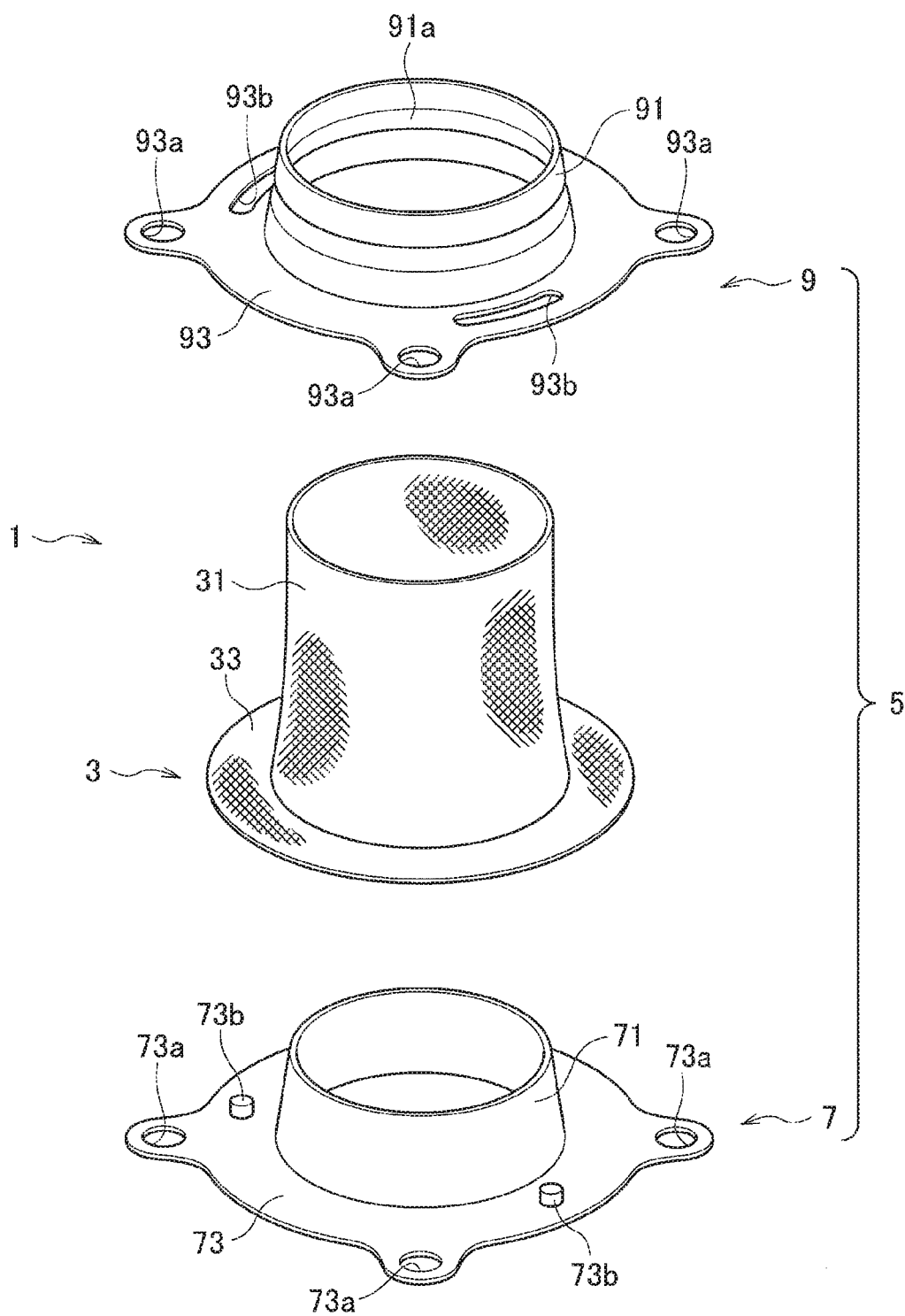
FIG. 1 is an exploded perspective view illustrating a shielding unit according to an embodiment.

A shielding unit according to an embodiment will be described with reference to the drawings. In the following description of the drawings, the same or similar portions are designated with the same or similar reference numerals. However, it should be noted that the drawings are consistently typical and therefore, the ratios of respective dimensions are different from actual ratios.

Accordingly, concrete dimensions etc. of respective elements should be evaluated in consideration of the following description. Also in the drawings, additionally, there may be included portions whose mutual relationships or ratios in dimension are different from each other among the drawings.

As illustrated in FIG. 1, the shielding unit 1 according to the embodiment is used to cover a bundle of wires (not illustrated), thereby constructing a shielding cable (not illustrated). The shielding unit 1 includes a cylindrical shielding member 3 including a braided wire made of metal, such as aluminum or copper, for covering the wire bundle, and a shielding shell 5 made of metal, which is to be connected to the shielding member 3. The shielding shell 5 includes a shell internal cylinder 7 and a shell external cylinder 9.

The shell internal cylinder 7 includes a disk-shaped internal cylinder flange portion 73 consecutively provided at an end of an internal cylindrical portion 71 in the form of a cylinder. The shell external cylinder 9 includes a disk-shaped external cylinder flange portion 93 consecutively provided at an end of an external cylindrical portion 91 in the form of a cylinder, into which the internal cylindrical portion 71 is press-fitted. The external cylindrical portion 91 is formed with an annular projecting portion 92a projecting inwardly. The annular projecting portion 91a comes into pressure contact with the internal cylindrical portion 71 press-fitted into the external cylindrical portion 91. In the circumferential rim of the internal cylinder flange portion 73, four attachment holes 73a are formed on shifting the phase by 90 degrees. Also in the circumferential rim of the external cylinder flange portion 93, four attachment holes 93a are formed on shifting the phase by 90 degrees.

On the internal cylindrical flange portion 73, three positioning pins 73b are provided so as to stand toward the internal cylindrical portion 71 (FIG. 1 illustrates two pins since one pin is hidden by the internal cylindrical portion 71). The positioning pins 73b are arranged at regular intervals (by 120 degrees) in the circumferential direction, concentrically with the internal cylindrical portion 71.

Three positioning guide holes 93b are formed so as to penetrate through the external cylinder flange portion 93 (FIG. 1 illustrates two guide holes since one guide hole is hidden by the external cylindrical portion 91). Each of the positioning guide holes 93b includes an arc-shaped elongated hole extending concentrically with the external cylindrical portion 91. In a state Where the internal cylindrical portion 71 is press-fitted into the external cylindrical portion 91, the positioning pins 73b are inserted through the positioning guide holes 93b, as illustrated in FIGS. 2A and 2B.

As illustrated in FIG. 2B, the shell external cylinder 9 is constructed so that when each positioning pin 73b is positioned at an end of each positioning guide hole 93b in the counterclockwise direction as viewed from a surface of the external cylinder flange portion 93 on the side of the external cylindrical portion 91, each attachment hole 93a overlaps each attachment holes 73a of the internal cylinder flange portion 73.

The numbers of the positioning pins 73b and the positioning guide holes 93b may be two, respectively, or may be four or more, respectively. Intervals between two positioning pins 73b or two positioning guide holes 93b adjacent to each other in the circumferential direction may be equal to each other, or may be disposed at irregular intervals in order to specify the press-fit position of the internal cylindrical portion 71 of the shell internal cylinder 7 with respect to the external cylindrical portion 91 of the shell external cylinder 9 in the circumferential direction.

Next, the procedures of connecting the shielding member 3 to the shielding shell 5 will be described.

Figure 3:
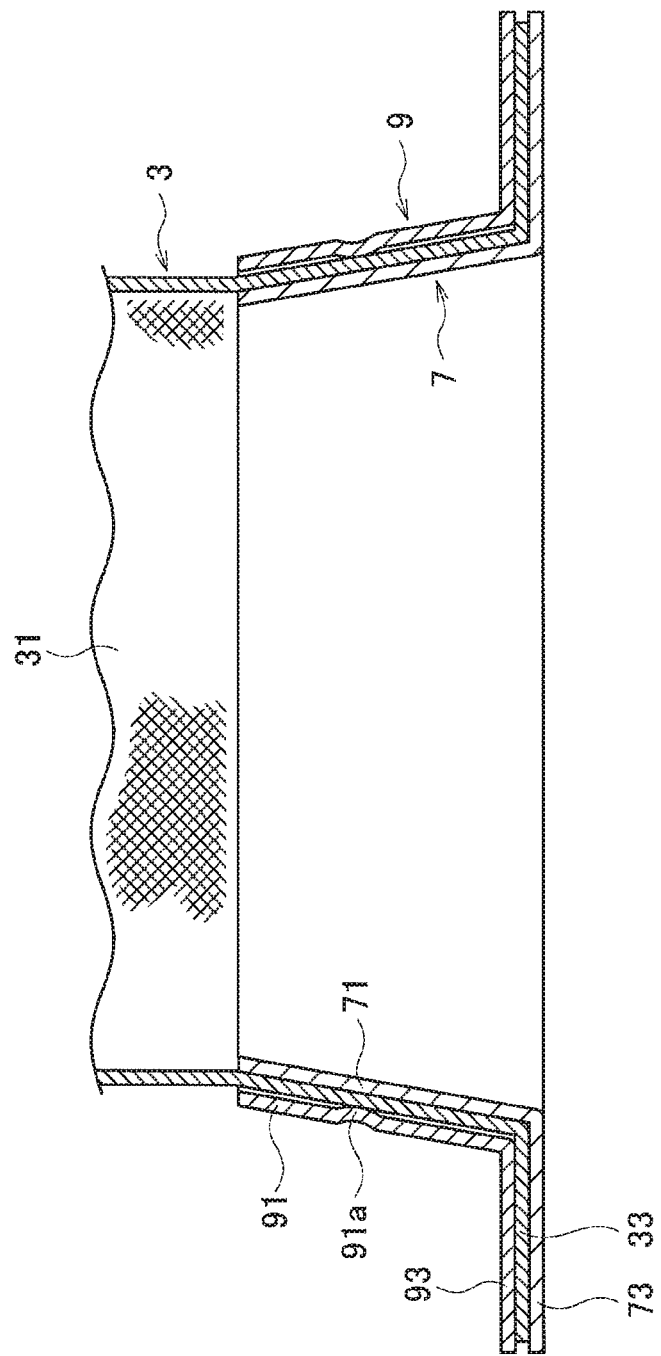
FIG. 3 is a sectional view illustrating an assembled state of the shielding unit sandwiching the shielding member by a shell external cylinder and a shell internal cylinder.

First, by bending an end of the shielding member 3 into a flange shape, a cylindrical portion 31 and a flange portion 33 are formed in the shielding member 3, as illustrated in FIG. 1. Subsequently, the internal cylindrical portion 71 is press-fitted into the external cylindrical portion 91, thereby assembling the shell internal cylinder 7 and the shell external cylinder 9 to each other. At the time, as illustrated in FIG. 3, it is carried out to sandwich the cylindrical portion 31 of the shielding member 3 by the internal cylindrical portion 71 and the external cylindrical portion 91, and further sandwich the flange portion 33 of the shielding member 3 by the internal cylinder flange portion 73 and the external cylinder flange portion 93.

At this time, the shell internal cylinder 7 is assembled to the shell external cylinder 9 so that, as illustrated in FIG. 2A, the respective attachment holes 73a, 93a do not overlap each other and instead, the positioning pins 73b are respectively inserted into the corresponding positioning guide holes 93b upon penetrating through the flange portion 33 of the shielding member 3 or together with the flange portion 33.

Next, as illustrated in FIG. 2B, it is carried out to rotationally move the shell internal cylinder 7 in relation to the shell external cylinder 9 in the counter-clockwise direction X (in the circumferential direction of the internal cylindrical portion 71 and the external cylindrical portion 91) until the respective positioning pins 73b of the shell internal cylinder 7 reach the ends of the respective positioning guide holes 93b of the shell external cylinder 9 in the counterclockwise direction.

In this case, the cylindrical portion 31 of the shielding member 3 slides against at least one of the internal cylindrical portion 71 of the shell internal cylinder 7 and the external cylindrical portion 91 of the shell external cylinder 9, both of which sandwich the cylindrical portion 31. Similarly, the flange portion 33 of the shielding member 3 slides against at least one of the internal cylinder flange portion 73 of the shell internal cylinder 7 and the external cylinder flange portion 93 of the shell external cylinder 9, both of which sandwich the flange portion 33.

Such sliding removes oxide films present on respective surfaces of the cylindrical portion 31 of the shielding member 3 and at least one of the internal cylindrical portion 71 and the external cylindrical portion 91, both of which operate as sliding counterparts of the cylindrical portion 31. Furthermore, in the flange portion 33 of the shielding member 3 and at least one of the internal cylinder flange portion 73 and the external cylinder flange portion 93, both of which operate as sliding counterparts of the flange portion 33, oxide films present on their surfaces are removed. In particular, as the internal cylindrical portion 71 and the external cylindrical portion 91 in the press-fit relationship slide against the cylindrical portion 31 at a high contact pressure, the removal of oxide films is promoted.

Then, in portions where the oxide films have been removed, the shielding member 3 is electrically connected to the shell internal cylinder 7 and the shell external cylinder 9 with high conductivity.

Thus, with the removal of oxide films on the shielding member 3 and the shielding shell 5 irrespective of a processing machine, it is possible to connect the shielding member 3 to the shielding shell 5 with high conductivity.

Figure 4:
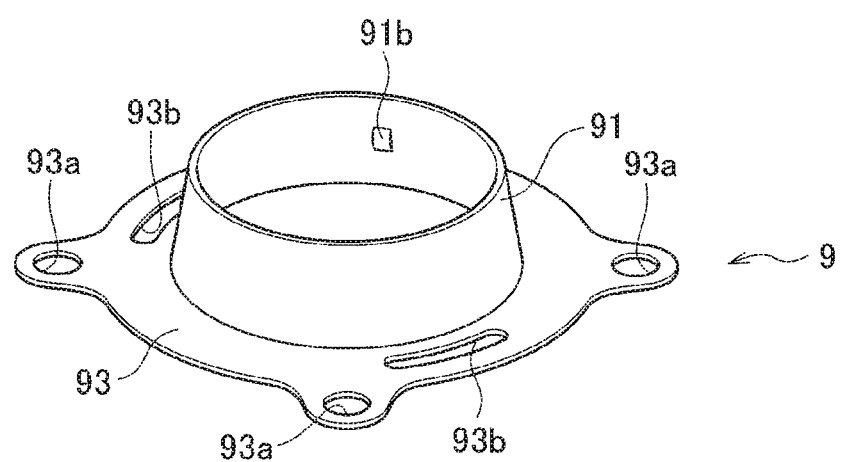
FIG. 4 is a perspective view illustrating a shell external cylinder of a shielding shell of a shielding unit according to a modification of the embodiment.

Instead of the annular projecting portion 91a, incidentally, a locking portion 91b protruding inward may be formed in the external cylindrical portion 91 of the shell external cylinder 9, as illustrated in FIG. 4. In that case, when the shell internal cylinder 7 is assembled to the shell external cylinder 9, the locking portion 91b is locked to the cylindrical portion 31 of the shielding member 3 sandwiched by the internal cylindrical portion 71 of the shell internal cylinder 7, as illustrated in FIG. 5. With this locking arrangement, the relative rotation of the cylindrical portion 31 in relation to the external cylindrical portion 91 is restrained. Thus, when the shell internal cylinder 7 is rotated relatively to the shell external cylinder 9, the cylindrical portion 31 and the internal cylindrical portion 71 slide against each other, while the flange portion 33 and the internal cylinder flange portion 73 slide against each other.

For this reason, it is possible to allow the cylindrical portion 31 and the flange portion 33 of the shielding member 3 to slide against the internal cylindrical portion 71 and the internal cylinder flange portion 73 of the shell internal cylinder 7 certainly, thereby ensuring the removal of oxide films on the shielding member 3 and the shell internal cylinder 7. Consequently, the shielding member 3 and the shielding shell 5 can be connected to each other with high conductivity.

Alternatively, the locking portion 91b may be formed so as to protrude from the outer circumferential face of the internal cylindrical portion 71 of the shell internal cylinder 7. Contrary to the embodiment described above, additionally, the external cylinder flange portion 93 may be provided with the positioning pins under condition that the internal cylinder flange portion 73 is provided with the positioning guide holes. Instead of folding the end of the shielding member 3 thereby forming the flange portion 33 as illustrated in FIG. 1, furthermore, the end of the shielding member 3 is also sandwiched by the internal cylindrical portion 71 of the shell internal cylinder 7 and the external cylindrical portion 91 of the shell external cylinder 9.

Furthermore, the shielding member 3 is not limited to only a braided wire as long as the same member is made from metal material whose surface contains an oxide film.

What is claimed is:

1. A shielding unit, comprising:
    a shielding member in a form of a cylinder having conductivity; and
    a shielding shell connected to an end of the shielding member,
    the shielding shell comprising:
        a shell internal cylinder having an internal cylinder flange portion provided at an end of an internal cylindrical portion in a form of a cylinder consecutively; and
        a shell external cylinder having an external cylinder flange portion consecutively provided at an end of an external cylindrical portion in a form of a cylinder into which the internal cylindrical portion is press-fitted, wherein
    the shielding member is sandwiched by the external cylindrical portion and the internal cylindrical portion press-fitted into the external cylindrical portion,
    the internal cylinder flange portion includes either one of a positioning pin and a positioning guide hole which are engaged with each other under condition that the shielding member is sandwiched by the external cylindrical portion and the internal cylindrical portion press-fitted into the external cylindrical portion,
    the external cylinder flange portion includes the other of the positioning pin and the positioning guide hole; and
    the positioning pin and the positioning guide hole are configured to position and guide a relative rotational position of the shell internal cylinder in relation to the shell external cylinder in the sandwiched condition, in a circumferential direction of the internal cylindrical portion and the external cylindrical portion.

2. The shielding unit of claim 1, wherein
    either one of the internal cylindrical portion and the external cylindrical portion is provided with a locking portion which is locked to the shielding member in the sandwiched condition to restrain a relative movement of the shielding member in the circumferential direction.

3. The shielding unit of claim 1, wherein
    the internal cylinder flange portion and the external cylinder flange portion are configured to sandwich an end of the shielding member under condition that the shielding member is sandwiched by the external cylindrical portion and the internal cylindrical portion press-fitted into the external cylindrical portion.

4. The shielding unit of claim 1, wherein
    the internal cylinder flange portion and the external cylinder flange portion are provided with attachment holes respectively, and
    the attachment hole of the internal cylinder flange portion and the attachment hole of the external cylinder flange portion are configured to overlap each other in a rotational position where the positioning pin is located at one end of the positioning guide hole in the circumferential direction.

* * * * *